United States Patent [19]
Dorri et al.

[11] Patent Number: 5,635,838
[45] Date of Patent: Jun. 3, 1997

[54] METHOD FOR OPERATING A SUPERCONDUCTIVE MAGNET

[75] Inventors: Bizhan Dorri, Clifton Park; Evangelos T. Laskaris; Howard R. Hart, Jr., both of Schenectady, all of N.Y.

[73] Assignee: General Electric Company, Schenectady, N.Y.

[21] Appl. No.: 597,789

[22] Filed: Feb. 7, 1996

[51] Int. Cl.⁶ .................................................. G01R 33/20
[52] U.S. Cl. ........................... 324/319; 324/320; 335/300
[58] Field of Search ..................................... 324/319, 318, 324/320, 322; 335/296, 297, 299, 302, 300

[56] References Cited

U.S. PATENT DOCUMENTS

| | | | |
|---|---|---|---|
| 4,771,244 | 9/1988 | Vermilyea | 324/320 |
| 4,895,831 | 1/1990 | Laskaris | 335/299 |
| 5,006,804 | 4/1991 | Dorri et al. | 324/320 |
| 5,045,794 | 9/1991 | Dorri et al. | 324/320 |
| 5,250,901 | 10/1993 | Kaufman et al. | 324/318 |
| 5,270,291 | 12/1993 | Sun et al. | 505/1 |
| 5,317,298 | 5/1994 | Dorri et al. | 324/319 |
| 5,439,543 | 8/1995 | Dorri et al. | 335/299 |
| 5,572,127 | 11/1996 | Wong et al. | 324/318 |

Primary Examiner—Sandra L. O'Shea
Assistant Examiner—Raymond Y. Mah
Attorney, Agent, or Firm—Douglas E. Erickson

[57] ABSTRACT

A method for operating a superconductive magnet having a superconductor. The magnet is ramped to generally the design current. After that, the magnet is brought to an annealing temperature which is above the operating temperature and below the critical temperature. After that, the magnet is shimmed at a shimming temperature which is at least as cold as the annealing temperature. After that, the magnet is used, at the operating temperature, for a predetermined purpose, such as MRI imaging for medical diagnosis. Preferably, the superconductor has less than twenty-five superconductive filaments.

10 Claims, 2 Drawing Sheets

METHOD FOR OPERATING A SUPERCONDUCTIVE MAGNET

BACKGROUND OF THE INVENTION

The present invention relates generally to magnets, and more particularly to a method for operating a superconductive magnet.

Superconducting magnets include, but are not limited to, closed and open magnet designs. Closed magnets have a single magnetic assembly with a bore in which is located the working magnetic field volume. Open magnets have two spaced-apart magnetic assemblies with generally coaxially aligned bores and a working magnetic field volume located in the open space between the magnetic assemblies. Open magnets have advantages in certain applications such as in MRI (magnetic resonance imaging) medical imaging where the open space helps the patient overcome any feelings of claustrophobia that may be experienced in a closed magnet design. A magnetic assembly contains one or more superconductive coils whose wound superconductor may embody any number of superconductive filaments. An example of a superconductor is a single niobium-tin tape filament sandwiched between upper and lower copper blankets for electrical stabilization surrounded by a paper sheath for electrical insulation.

Superconducting magnets must be cooled to below the critical temperature of the superconductor for superconductivity to occur. Known cooling techniques employ liquid cryogens (e.g., liquid helium) or cryocoolers, as is well known to those skilled in the art. Cryocoolers are more prone to temperature rises, such as a very slow rise in temperature over the lifetime of the cryocooler. Eventually, a cryocooler will be considered to fail when the temperature of the superconductor reaches its critical temperature and the magnet thereupon quenches (i.e., loses its superconductivity). It is noted that the magnet also may be intentionally quenched, by activating heaters, whenever it is desired to terminate the magnet's superconductive mode of operation.

Magnetic resonance imaging magnets have an inhomogeneity of the magnetic field in the working magnetic field volume due to manufacturing tolerances and site conditions. In many applications, the open or closed magnet must be shimmed to reduce the inhomogeneity of the magnetic field in the working magnetic field volume to within a predetermined specification. For example, an open MRI magnet whose magnetic assemblies are superconductive coil assemblies must be shimmed to reduce the inhomogeneity of the magnetic field in its working magnetic field volume, which is its imaging volume, to within a few parts per million to produce images which are sharp enough to be useful in medical diagnosis.

Known methods for shimming closed superconductive MRI magnets include active shimming and passive shimming. Active shimming typically requires a complex arrangement of superconductive shimming coils. Passive shimming typically involves the placement of carbon steel shims of calculated thickness in the bore of the closed magnet at calculated locations on the inside diameter of the superconductive coil assembly. The thickness and location of the shims are determined through use of a computer shim code, as is known to those skilled in the art, which calculates adding shims to reduce the inhomogeneity of the mapped magnetic field in the imaging volume of the closed MRI magnet. The calculated shims are added to the magnet, the magnetic field of the magnet is again mapped, and the computer shim code is again run. This process is repeated until the inhomogeneity of the measured magnetic field in the imaging volume is reduced to within a predetermined specification. The repetitive nature of the shimming process is the result of the computer shim code being only an approximation of the real magnet.

Superconductive magnets have a design current, an operating temperature, and a superconductor, wherein the superconductor has a critical temperature greater than the operating temperature. Known methods for operating superconductive magnets include the steps of ramping up the superconductive magnet to generally the design current at the operating temperature, then shimming the superconductive magnet to a desired level of homogeneity, and then using the magnet. If the desired level of homogeneity is lost (typically when ferromagnetic material is introduced near the magnet), the magnet is again shimmed. Applicants found that it was necessary, in operating superconductive magnets having less than twenty-five superconductive filaments, to reshim them whenever the operating temperature increased (such as when a faulty cryocooler was replaced with a new one of slightly-higher temperature or when a cryocooler slowly increased temperature over time) even though the operating temperature remained below the critical temperature and even though there was no change in manufacturing tolerances and/or site conditions What is desired is a method for operating a superconductive magnet having less than twenty-five superconductive filaments that does not require reshimming for such slight temperature rises.

SUMMARY OF THE INVENTION

The method of the invention is for operating a superconductive magnet having a design current, an operating temperature, and a superconductor. The superconductor has a critical temperature greater than the operating temperature. The basic method includes the following steps. In step a), the superconductive magnet is ramped up to generally the design current. In step b), which is performed after step a), the superconductive magnet is brought, at generally the design current, to an annealing temperature which is above the operating temperature and below the critical temperature. In step c), which is performed after step b), the superconductive magnet is shimmed, at a shimming temperature which is at least as cold as the annealing temperature, to a desired level of homogeneity. In step d), which is performed after step c), the superconductive magnet is used, at generally the operating temperature, for a predetermined purpose.

In an exemplary method of the invention, there is included, between steps b) and c), the step of bringing the superconductive magnet to a temperature equal to generally the operating temperature, and wherein the shimming temperature in step c) is equal to generally the operating temperature. In a preferred method of the invention, steps a), b), and d) are repeated, but step c) is not repeated, if the desired level of homogeneity is still present and if the superconductive magnet has a temperature greater than the critical temperature (i.e., the magnet lost its superconductivity).

Several benefits and advantages are derived from the invention. Applicants performed experiments which showed that by shimming the superconductive magnet after first having annealed it, the desired level of homogeneity is maintained during superconductivity despite slight rises in temperature provided the temperature does not exceed the annealing temperature. Applicants' experiments also showed that even if the temperature rose to above the critical temperature (i.e., even if the magnet quenched losing its superconductivity), the magnet could still be used for its predetermined purpose, with its desired level of homogeneity maintained, by first repeating the ramping and annealing steps without having also to repeat the shimming step.

BRIEF DESCRIPTION OF THE DRAWINGS

The accompanying drawings illustrate a preferred embodiment of the present invention wherein.

DETAILED DESCRIPTION OF THE INVENTION

Figure 1:
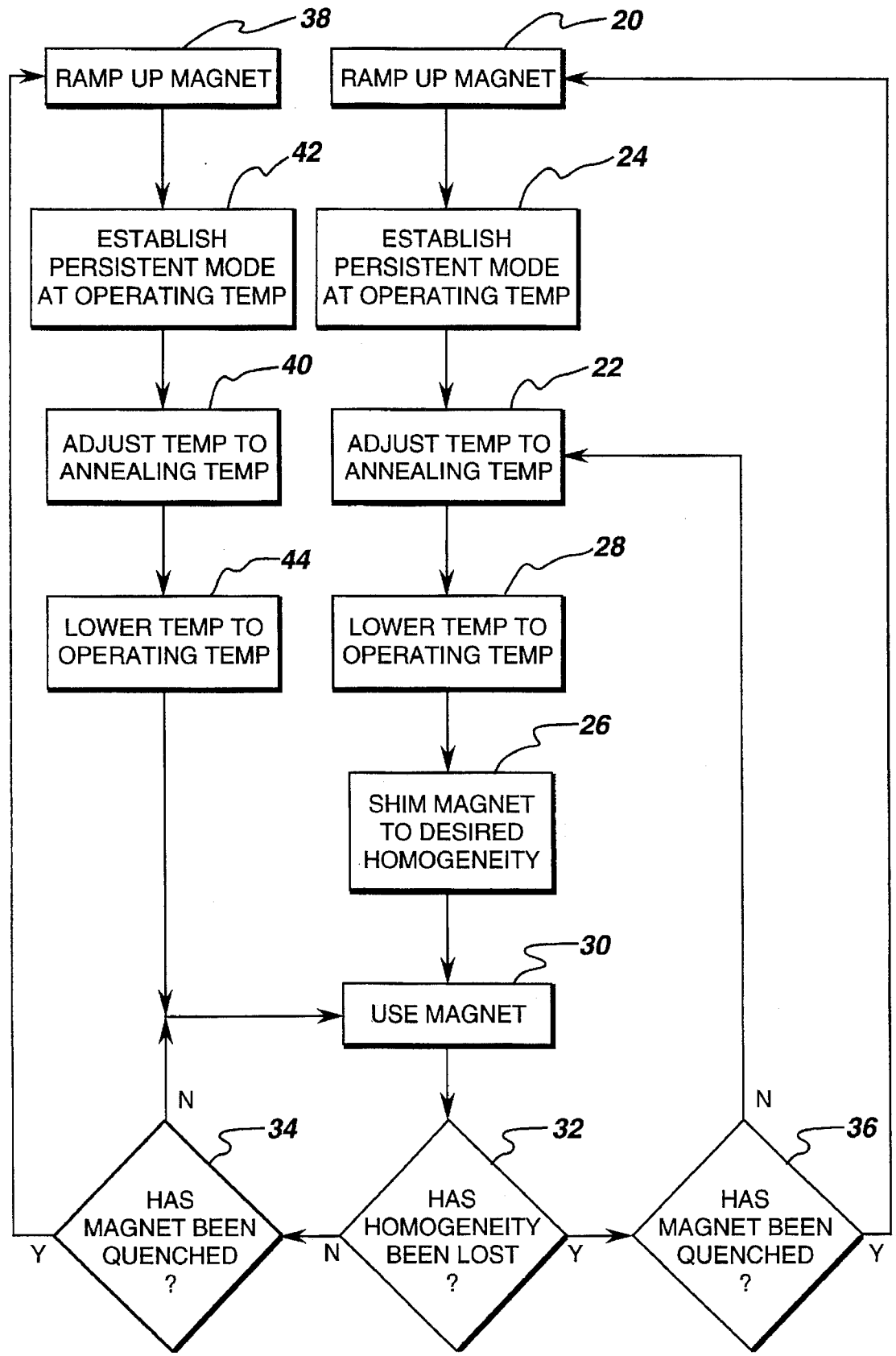
FIG. 1 is a block diagram (flow chart) of a preferred method of the present invention for operating a superconductive magnet having a coil-wound superconductor.
Figure 2:
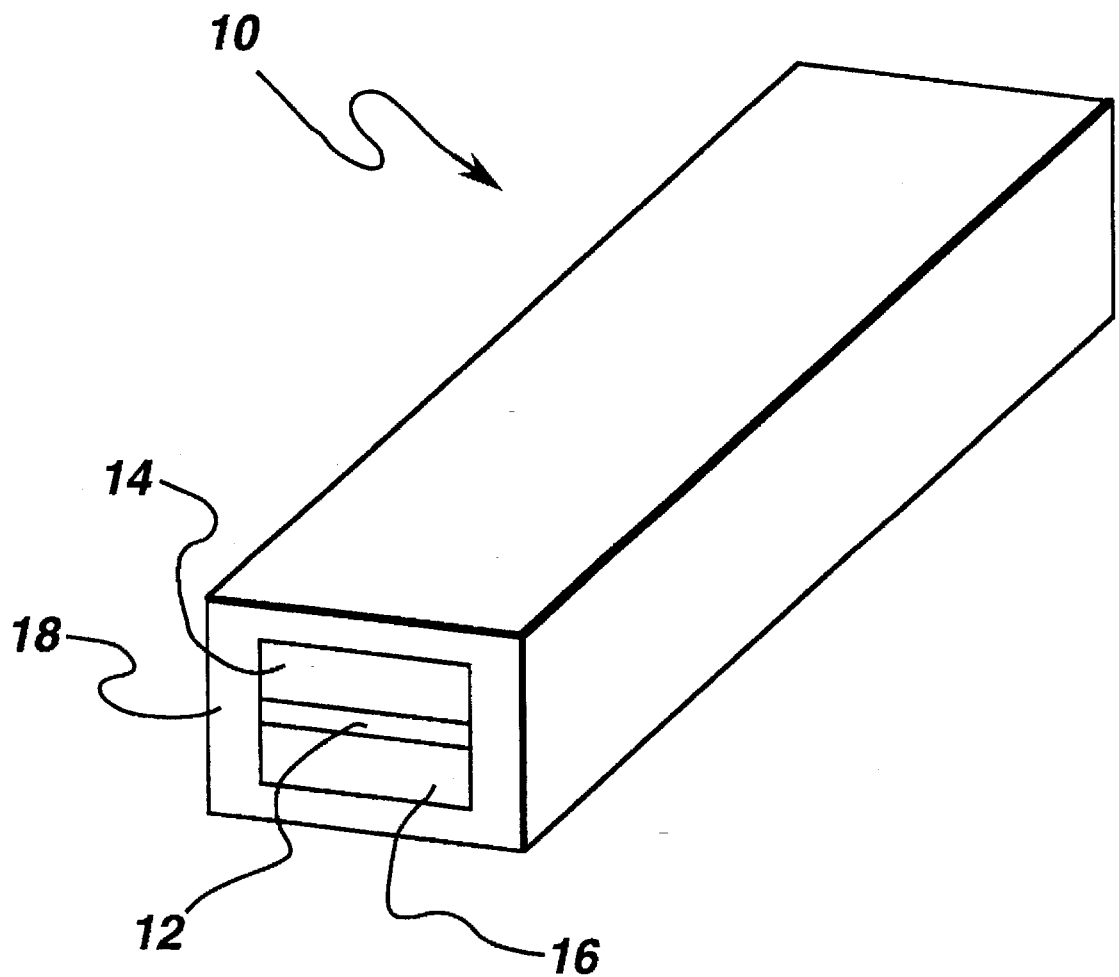
FIG. 2 is a perspective view of a short length of a preferred embodiment of an unwound superconductor having a single superconductive filament.

Referring now to the drawings, wherein like numerals represent like elements throughout, FIG. 1 shows in block diagram form a preferred method of the invention for operating a superconductive magnet (not shown) having a design current, an operating temperature, and a superconductor 10 (a preferred unwound portion of which is shown in FIG. 2). The superconductor 10 has a critical temperature greater than the operating temperature. An exemplary embodiment of the superconductor 10 has less than twenty-five superconductive filaments 12 (only one of which is shown in FIG. 2). Preferably, the superconductor 10 has a single superconductive filament 12 which consists essentially of a niobium-tin tape filament, which is sandwiched between upper and lower copper blankets 14 and 16 for electrical stabilization, and which is surrounded by a paper sheath 18 for electrical insulation.

The basic method of the invention begins with step a) portrayed in block 20 of FIG. 1 as "Ramp up magnet". Step a) includes ramping up the superconductive magnet to generally the design current. An example, without limitation, of a preferred design current is a current of generally 100 amperes.

After step a), the basic method continues with step b) portrayed in block 22 of FIG. 1 as "Adjust temp to annealing temp." Step b) includes bringing the superconductive magnet, at generally the design current, to an annealing temperature which is above the operating temperature and below the critical temperature. Typically, the annealing temperature is chosen to be just below the critical temperature. Examples, without limitation, of preferred temperature values include: generally 12.8 Kelvin for the annealing temperature; generally 10 Kelvin for the operating temperature; and generally 13 Kelvin for the critical temperature.

A preferred method also includes, between steps a) and b), a procedure portrayed in block 24 of FIG. 1 as "Establish persistent mode at operating temp". This procedure includes the step of bringing the superconductive magnet to a temperature equal to generally the operating temperature and the step of thereafter putting the superconductive magnet in a persistent superconducting mode (via a superconductive switch which electrically disconnects the external power supply, as is known to those skilled in the art). It is noted that the operating temperature of a superconductive magnet: is simply the temperature of the magnet when it is operating in the superconducting mode; depends upon the particular cooling employed; is generally constant (typically to within one-hundredth of a degree) over a short period of time (such as eight hours); typically slowly rises over time due to normal deterioration in the particular cooling employed; and may slightly increase after the employment of new cooling (such as a new but higher-operating-temperature cryocooler).

After step b), the basic method proceeds with step c) portrayed in block 26 of FIG. 1 as "Shim magnet to desired homogeneity". Step c) includes shimming the superconductive magnet, at a shimming temperature which is at least as cold as the annealing temperature, to a desired level of homogeneity. The choice of shimming method and the details thereof are left to the artisan. For example, passive ferromagnetic shims may be employed using conventional methods known to those skilled in the art. Preferably, the shimming temperature in step c) is equal to generally the operating temperature, and an exemplary method also includes, between steps b) and c), a procedure portrayed in block 28 as "Lower temp to operating temperature". This procedure includes the step of bringing the superconductive magnet to a temperature equal to generally the operating temperature.

After step c), the basic method progresses with step d) portrayed in block 30 as "Use magnet". Step d) includes using the superconductive magnet, at generally the operating temperature, for a predetermined purpose. An example, without limitation, of a predetermined purpose is using the superconductive magnet for MRI medical imaging. The basic method will not require reshimming for increased temperatures which remain below the annealing temperature of step b). Applicants have experimentally found this to be true. This is indicated in FIG. 1 by following the unnumbered flow arrow associated with the "No" decision in block 32 (such block entitled "Has homogeneity been lost?") and by following the unnumbered flow arrow associated with the "No" decision in block 34 (such block entitled "Has magnet been quenched?"). Applicants' theory is that the annealing step in the method of the invention moves the current flow deeper in the filament and keeps it there even when the temperature thereafter is lowered. Otherwise, without the annealing step, a superconductive magnet would have to be reshimmed as the current moved deeper in the filament each time the temperature slightly increased. This is so because a changed current spatial density would disturb the homogeneity of the magnetic field of the magnet. It is pointed out that a superconductor having more than twenty-five superconductive filaments typically has such relatively thin filaments that current moving deeper in the filament due to a temperature rise has a negligible effect on the current spatial density and therefore has a negligible effect on the homogeneity of the magnetic field. However, it is noted that future magnet designs may include superconductors having more than twenty-five relatively thick filaments.

A preferred method of the invention includes, after step d), repeating steps a) through d) if the desired level of homogeneity is lost (typically if ferromagnetic material is introduced to the magnet site, such as introducing new medical equipment near a hospital MRI magnet, or if the temperature exceeded the annealing temperature) and if the superconductive magnet has a temperature greater than the critical temperature (i.e., if the magnet has been accidentally or intentionally quenched). This step repetition is indicated in FIG. 1 by following the unnumbered flow arrow associated with the "Yes" decision in block 32 (such block entitled "Has homogeneity been lost?") and by following the unnumbered flow arrow associated with the "Yes" decision in block 36 (such block entitled "Has magnet been quenched?").

An exemplary method of the invention includes, after step d), repeating steps b) through d) if the desired level of homogeneity is lost and if the superconductive magnet has a temperature less than the critical temperature. This step repetition is indicated in FIG. 1 by following the unnumbered flow arrow associated with the "Yes" decision in block 32 (such block entitled "Has homogeneity been lost?") and by following the unnumbered flow arrow associated with the "No" decision in block 36 (such block entitled "Has magnet been quenched?").

A desired method of the invention includes, after step d), repeating steps a), b), and d), but not step c), if the desired level of homogeneity is still present and if the superconductive magnet has a temperature greater than the critical temperature. This step repetition is indicated in FIG. 1 by following the unnumbered flow arrow associated with the "No" decision in block 32 (such block entitled "Has homogeneity been lost?"), by following the unnumbered flow arrow associated with the "Yes" decision in block 34 (such block entitled "Has magnet been quenched?"), by block 38 (which is identical to block 20), and by block 40 (which is identical to block 22). Preferably and as shown in FIG. 1, the desired method further includes block 42 (which is identical to block 24) and block 44 (which is identical to block 28) with block 40 disposed therebetween.

The foregoing description of a preferred embodiment of the invention has been presented for purposes of illustration. It is not intended to be exhaustive or to limit the invention to the precise form disclosed, and obviously many modifications and variations are possible in light of the above teaching. It is intended that the scope of the invention be defined by the claims appended hereto.

We claim:

1. A method for operating a superconductive magnet having a design current, an operating temperature, and a superconductor, wherein said superconductor has a critical temperature greater than said operating temperature and, and wherein said method comprises the steps of:

a) ramping up said superconductive magnet to generally said design current;

b) after step a), bringing said superconductive magnet, at generally said design current, to an annealing temperature which is above said operating temperature and below said critical temperature;

c) after step b), shimming said superconductive magnet, at a shimming temperature which is at least as cold as said annealing temperature, to a desired level of homogeneity; and d) after step c), using said superconductive magnet, at generally said operating temperature, for a predetermined purpose.

2. The method of claim 1, also including, between steps b) and c), the step of bringing said superconductive magnet to a temperature equal to generally said operating temperature, and wherein said shimming temperature in step c) is equal to generally said operating temperature.

3. The method of claim 1, also including, between steps a) and b), the steps of bringing said superconductive magnet to a temperature equal to generally said operating temperature and putting said superconductive magnet in a persistent superconducting mode.

4. The method of claim 1, also including, after step d), repeating steps a) through d) if said desired level of homogeneity is lost and if said superconductive magnet has a temperature greater than said critical temperature.

5. The method of claim 1, also including, after step d), repeating steps b) through d) if said desired level of homogeneity is lost and if said superconductive magnet has a temperature less than said critical temperature.

6. The method of claim 1, also including, after step d), repeating steps a), b), and d), but not step c), if said desired level of homogeneity is still present and if said superconductive magnet has a temperature greater than said critical temperature.

7. The method of claim 6, also including, after step d), the steps of:

repeating steps a) through d) if said desired level of homogeneity is lost and if said superconductive magnet has a temperature greater than said critical temperature; and repeating steps b) through d) if said desired level of homogeneity is lost and if said superconductive magnet has a temperature less than said critical temperature.

8. The method of claim 1, wherein said superconductor has less than twenty-five superconductive filaments.

9. The method of claim 8, wherein said superconductor has a single superconductive filament, and wherein said single superconducting filament consists essentially of a niobium-tin tape filament.

10. The method of claim 9, wherein said design current is generally 100 amperes, said operating temperature is generally 10 Kelvin, said critical temperature is generally 13 Kelvin, and said annealing temperature is generally 12.8 Kelvin.

* * * * *